(12) United States Patent
Zojer et al.

(10) Patent No.: US 9,793,260 B2
(45) Date of Patent: Oct. 17, 2017

(54) SYSTEM AND METHOD FOR A SWITCH HAVING A NORMALLY-ON TRANSISTOR AND A NORMALLY-OFF TRANSISTOR

(71) Applicant: Infineon Technologies Austria AG, Villach (AT)

(72) Inventors: Bernhard Zojer, Villach (AT); Matteo-Alessandro Kutschak, Ludmannsdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/822,530

(22) Filed: Aug. 10, 2015

(65) Prior Publication Data
US 2017/0047841 A1 Feb. 16, 2017

(51) Int. Cl.
| | |
|---|---|
| H02M 3/156 | (2006.01) |
| H01L 27/06 | (2006.01) |
| H02M 1/42 | (2007.01) |
| H02M 7/219 | (2006.01) |
| H03K 17/10 | (2006.01) |
| H03K 17/567 | (2006.01) |
| H03K 17/687 | (2006.01) |

(52) U.S. Cl.
CPC ...... *H01L 27/0629* (2013.01); *H02M 1/4233* (2013.01); *H02M 7/219* (2013.01); *H03K 17/10* (2013.01); *H03K 17/567* (2013.01); *H03K 2017/6875* (2013.01); *H03K 2017/6878* (2013.01); *H03K 2217/0081* (2013.01)

(58) Field of Classification Search
CPC .............. H02M 3/158; H01L 29/7787; H01L 27/0629; H01L 29/2003; H03K 17/567; H03K 2217/0036; H03K 17/687

USPC ........ 323/271; 327/108, 109, 112, 430, 434; 257/109, 133, 134, 615, 76, 195
See application file for complete search history.

(56) References Cited

U.S. PATENT DOCUMENTS

| | | | | |
|---|---|---|---|---|
| 4,384,287 A | * | 5/1983 | Sakuma | G09G 3/296 315/169.4 |
| 5,285,369 A | | 2/1994 | Balakrishnan | |
| 5,746,499 A | * | 5/1998 | Ratcliffe | A43B 3/001 36/137 |

(Continued)

FOREIGN PATENT DOCUMENTS

DE 102010027832 B3 7/2011

OTHER PUBLICATIONS

Search report from EIC 2800 STIC searcher John DiGeronimo received on Aug. 22, 2016.*

Primary Examiner — Timothy J Dole
Assistant Examiner — Htet Z Kyaw
(74) Attorney, Agent, or Firm — Slater Matsil, LLP

(57) ABSTRACT

In accordance with an embodiment, a method includes conducting a reverse current through a first switch that includes a normally-on transistor coupled in series with a normally-off transistor between a first switch node and a second switch node. While conducting the reverse current, the first switch is turned-off by turning-off the normally-off transistor via a control node of the normally-off transistor and reducing a drive voltage of the normally-on transistor by decreasing a voltage between the control node of the normally-on transistor and a reference node of the normally-on transistor. After turning-off the first switch, a second switch coupled to the first switch is turned on.

28 Claims, 11 Drawing Sheets

(56) References Cited

U.S. PATENT DOCUMENTS

| | | |
|---|---|---|
| 7,408,399 B2 | 8/2008 | Salato et al. |
| 7,777,553 B2 | 8/2010 | Friedrichs |
| 7,961,482 B2 | 6/2011 | Ribarich |
| 8,228,114 B1 * | 7/2012 | Cilio ................... H03K 17/567 327/430 |
| 8,233,250 B2 * | 7/2012 | Burns .................... H02M 1/32 361/18 |
| 8,487,667 B2 * | 7/2013 | Iwamura ............. H03K 17/567 327/108 |
| 8,710,543 B2 * | 4/2014 | Ichikawa ............. H03K 17/107 257/133 |
| 8,723,589 B2 * | 5/2014 | Biela ................... H03K 17/102 327/430 |
| 8,810,287 B2 * | 8/2014 | Hayashi ............... H03K 17/063 327/109 |
| 9,083,343 B1 * | 7/2015 | Li ........................ H03K 17/063 |
| 9,142,544 B2 * | 9/2015 | Ikeda .................. H01L 27/0255 |
| 9,159,725 B2 * | 10/2015 | Forghani-Zadeh . H01L 27/0883 |
| 9,276,569 B2 * | 3/2016 | Ikeda .................... H01L 25/072 |
| 9,306,544 B2 * | 4/2016 | Jeon ....................... H03K 3/012 |
| 9,350,342 B2 * | 5/2016 | Zojer .................... H03K 17/687 |
| 9,356,015 B2 * | 5/2016 | Ohshima .............. H03K 17/102 |
| 2001/0024138 A1 * | 9/2001 | Dohnke ............... H01L 27/085 327/434 |
| 2002/0153938 A1 * | 10/2002 | Baudelot .............. H01L 27/098 327/430 |
| 2008/0197908 A1 * | 8/2008 | Williams .............. H02M 3/155 327/431 |
| 2011/0199148 A1 * | 8/2011 | Iwamura .............. H03K 17/567 327/430 |
| 2011/0221480 A1 * | 9/2011 | Ikeda ............... H03K 17/04123 327/109 |
| 2011/0299202 A1 * | 12/2011 | Cai ....................... H02H 9/046 361/56 |
| 2012/0133420 A1 * | 5/2012 | Draxelmayr .......... H02M 3/337 327/430 |
| 2012/0280271 A1 * | 11/2012 | Ichikawa .............. H03K 17/107 257/133 |
| 2013/0187713 A1 * | 7/2013 | Acar ...................... H03F 1/223 330/251 |
| 2013/0335134 A1 * | 12/2013 | Kanazawa .......... H01L 27/0883 327/404 |
| 2014/0027785 A1 * | 1/2014 | Rose ................. H03K 17/08122 257/77 |
| 2015/0018656 A1 * | 1/2015 | Min ....................... A61B 18/12 600/372 |
| 2015/0357321 A1 * | 12/2015 | Ikeda .................. H01L 27/0255 257/76 |
| 2016/0094218 A1 * | 3/2016 | van Otten ............ H03K 17/102 327/427 |
| 2016/0218100 A1 * | 7/2016 | Ikeda .................. H01L 27/0629 |
| 2016/0233859 A1 * | 8/2016 | Roberts ............ H03K 17/04123 |

\* cited by examiner

|  | A | B | C | D |
|---|---|---|---|---|
| Normally-on transistor (Q1) | OFF | ON | OFF | ON |
| Normally-off transistors (Q2) | OFF | OFF | ON | ON |
| Qsc normal | OFF | OFF | OFF | ON |
| Qsc reverse | ON | ON | ON | ON |
| ΔVdio | Vd2+Vd1 | Vd2 | Vd1 | 0 |

SYSTEM AND METHOD FOR A SWITCH HAVING A NORMALLY-ON TRANSISTOR AND A NORMALLY-OFF TRANSISTOR

TECHNICAL FIELD

The present disclosure relates generally to an electronic device, and more particularly to a system and method for a system and method for a switch having a normally-on transistor and a normally-off transistor.

BACKGROUND

High voltage switching transistors, such as power MOSFETs, junction field effect transistor (JFETs) and gallium nitride (GaN) high electron mobility transistor (HEMT), are commonly used as semiconductor switches in high voltage and high power devices such as switched-mode power supplies, motor controllers, and high voltage and high power switching circuits. Some of these devices, such as the GaN HEMT have the ability to be operated at very high voltages without the device breaking down or becoming damaged.

Some devices, such as the JFET and the GaN HEMT may be fabricated to have a negative threshold voltage, thereby causing the device to be conductive when zero voltage is across the gate and source of these transistors. Such devices are accordingly referred to as "normally-on" devices or transistors, since the devices are effectively on under zero bias conditions. When using such normally-on transistors, provisions are generally made to ensure that a voltage is generated to make sure that the normally-on transistor may be turned off. For example, in a driver circuit used in a switch mode power supply, a negative voltage is generated or provided that has a voltage that is sufficiently below the threshold of the normally-on transistor to ensure that the device is in fact turned off as intended. Alternatively, the normally-on switch can be operated in a series connection with a normally-off switch to achieve overall normally-off behavior.

SUMMARY OF THE INVENTION

In accordance with an embodiment, a method includes conducting a reverse current through a first switch that includes a normally-on transistor coupled in series with a normally-off transistor between a first switch node and a second switch node. While conducting the reverse current, the first switch is turned-off by turning-off the normally-off transistor via a control node of the normally-off transistor and reducing a drive voltage of the normally-on transistor by decreasing a voltage between the control node of the normally-on transistor and a reference node of the normally-on transistor. After turning-off the first switch, a second switch coupled to the first switch is turned on.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
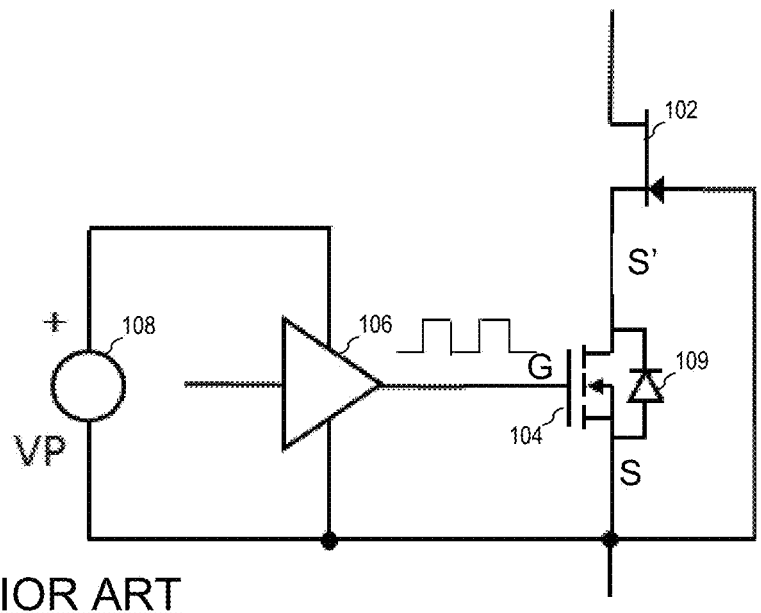
FIGS. 1a and 1b illustrate conventional switch driving systems for series-connected switches.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for driving a switch having a normally-on transistor coupled in series with a normally-off transistor. Embodiments of the present invention may also be applied to various systems that utilize such a circuit structure, for example, switched-mode power supplies.

In an embodiment of the present invention, a switch controller configured to drive a compound switch having a normally-on transistor in series with a normally-off transistor includes a driver circuit configured to simultaneously shut-off the normally-on transistor and the normally-off transistor if the switch is operated in "diode" mode. (reverse conduction). Such a mode of operation may occur, for example, when an inductor coupled to half-bridge switch acts like a current source. In some embodiments, shutting-off both the normally-on and normally-off transistors simultaneously reduces power loss caused by the discharging of parasitic capacitances of the normally-on transistor.

Certain types of power transistors, such as junction field effect transistor (JFETs), gallium nitride (GaN) high electron mobility transistor (HEMT), silicon carbide (SiC) FETs, and depletion-mode MOSFET devices behave as "normally-on" devices in that they are in a conductive state when zero volts is applied between a control node and a reference node of the transistor, which in this case corresponds to the gate and the source of the transistor. In some embodiments, these normally-on devices may be implemented as n-channel or p-channel devices. In order to switch these transistors off, a sufficiently high negative gate voltage is applied between the gate and the source of the transistor. For example, in the case of a GaN HEMT, this reverse voltage may be between about −5 V and about −8 V; however, turn off voltages outside of this range may also occur in some devices. Accordingly, in some systems, such as those that utilize charge pumps to develop negative bias voltages, there is a risk that the normally-on transistor may cause a short circuit between the power supply rails of the device before the charge pump has sufficient time to produce a sufficiently high negative voltage to turn off the normally-on transistor. Moreover, there is also a risk of short circuits during various fault conditions.

One way in which this issue has been dealt with is by coupling the normally-on transistor in series with a normally-off transistor such as an enhancement mode MOSFET device in a cascode configuration, as illustrated in FIG. 1a. As shown, the source of the normally-on transistor 102 is coupled to the drain of the normally-off transistor 104 at node S', and the gate G of the normally-off transistor 104 is driven by driver circuit 106. Diode 109 represents the body diode of normally-off transistor 104.

Here, the gate G of the normally-off transistor 104 acts as the control terminal that is driven by driver circuit 106, whereas the gate of normally-on transistor 102 is connected to the source S of normally-off transistor 104. During startup, the series combination of the normally-on transistor and the normally-off transistor is non-conductive. Once the requisite supply voltage becomes available, the normally-off transistor may be driven with an input signal, such that the normally-on transistor functions as a cascode device. If the current flow through the switch is forced in the reverse direction, the body diode BD of normally-off transistor 104 becomes forward biased, thus current flows in the direction of the polarity of the body diode. Due to the circuit topology (i.e. connecting the gate node G of normally-on transistor 102 with the source node S of normally-off transistor 104), the normally-on transistor remains in its on-state, i.e. VGD>0.

Voltage source 108, having a voltage VP, provides power to driver circuit 106. Thus, when the output of driver circuit 106 is high, a voltage of approximately VP may be provided to the gate of normally-off transistor 104. On the other hand, when the output of driver circuit 106 is low, zero volts are provided between the gate and source of transistor 104, thereby turning off normally-off transistor 104.

There are, however, a number of issues with the composite device when operated as a cascode. First, switching losses may occur because the gate-source capacitance of normally-on transistor 102 is charged by the high-voltage power supply and not by the low gate driver supply voltage. Furthermore, additional switching losses may occur because of the drain capacitance of normally-off transistor 104, which may be a very large device in order to have a low impedance. As the parasitic drain capacitance of normally-off transistor 104 is being charged and discharged during operation, power is lost. In some cases, the driver circuit 106 used to drive normally-off transistor 104 may be referenced to the drain of the normally-off transistor to reduce transients as described in co-pending and commonly assigned U.S. patent application Ser. No. 14/473,101, filed on Aug. 29, 2014, which is incorporated herein by reference in its entirety.

Another issue with the cascode configuration is that there is a potential for voltage stress on normally-off transistor 104. For example, during operation, the voltage at node S' may have large voltage transients due to capacitive coupling from the drain of normally-on transistor 102. In other words, the voltage at node S' goes beyond the negative threshold of normally-on transistor 102, and may reach 20 V and above in some fast switching conditions. There exists a trade-off between voltage stress at node S' and switching losses.

Figure 1B:
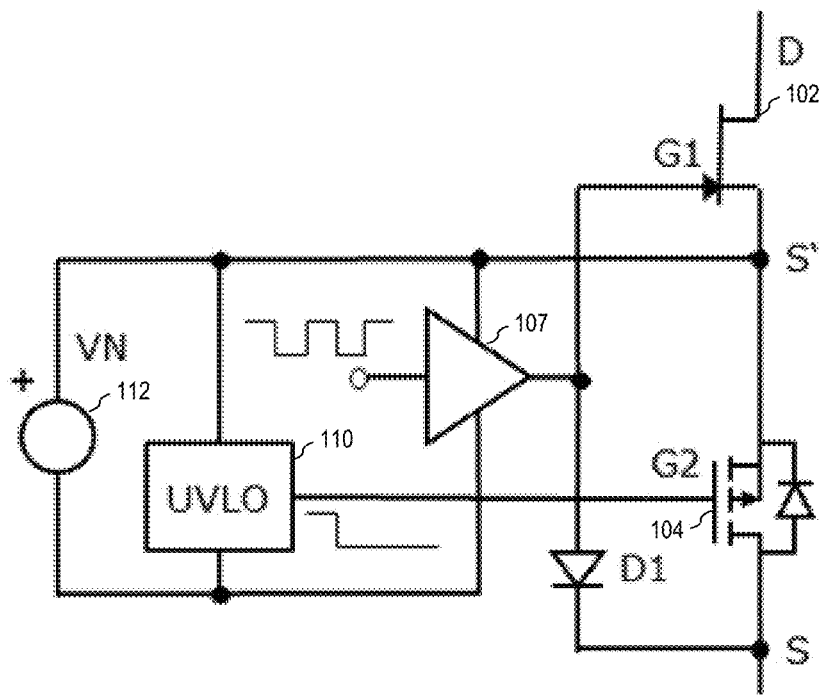

FIG. 1b illustrates another manner in which a compound device including a normally-on transistor and a normally-off transistor may be operated. Here, the gate G1 of normally-on transistor 102 is directly driven using driver 107 and gate G2 of normally-off transistor 104 is turned on according to the output of under voltage lockout block 110, which turns on normally-off transistor 104 after power supply 112 has reached a voltage sufficient to turn off normally-on transistor 102. During normal operation, normally-off transistor 104 remains in an on state. During startup and failure conditions, normally-off transistor 104 may be shut off, and diode D1 prevents the drain voltage of the normally-off transistor from reaching high voltages by clamping the gate G1 of normally-on transistor 102 to the source voltage of normally-off transistor 104. In such a directly driven configuration, however, the dedicated drivers may be needed to drive both gates G1 and G2 of normally-on transistor 102 and normally-off transistor 104. Another issue with the directly driven approach is that a high reverse current across the series connected devices results in a high voltage drop across normally-on transistor 102.

A further manner in which a compound device may be operated is a "dual drive" approach in which the compound switch is either driven as a cascode device in which the switching signal is applied to the normally-off transistor, or is driven as a directly driven device in which the switching signal is applied to the normally-on transistor as described in U.S. patent application Ser. No. 14/473,207, filed on Aug. 29, 2014, which is incorporated by reference herein in its entirety.

Figure 2A:
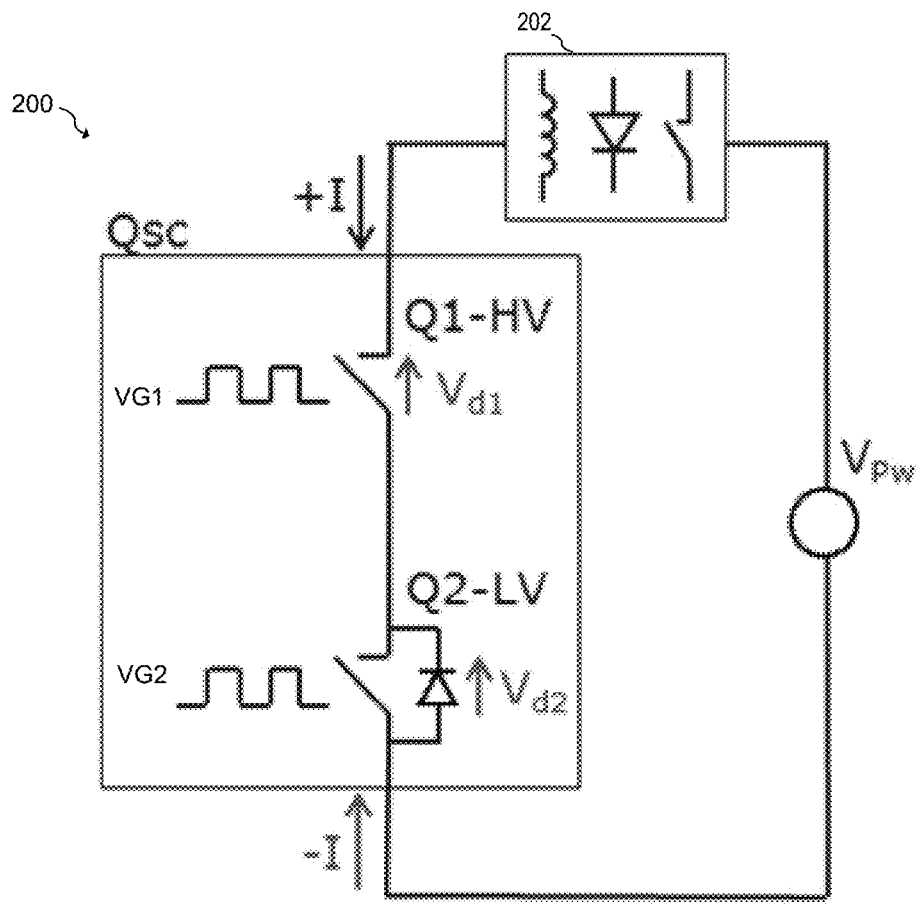
FIGS. 2a to 2c illustrate a block diagram of a compound switch, as well as an associated I/V plot and a state table.

FIG. 2a illustrates a generalized view of embodiment switching system 200 that includes a generalized composed power transistor Qsc having a high voltage switching transistor component Q1-HV coupled in series with a low voltage switching transistor component Q2-LV. This generalized composed power transistor Qsc is coupled to generalized load 202 that may include, for example, a inductor, a diode, a switch and/or other electronic components. In an embodiment, both high voltage switching transistor component Q1-HV and low voltage switching transistor component Q2-LV may be controlled to be either in an "on" state (low impedance) or "off" state (high impedance) using dedicated 2-level gate drive signals VG1 and VG2, respectively. In one embodiment, low voltage switching transistor component Q2-LV is implemented by a low voltage normally-off transistor coupled to a positive voltage VP to be switched "on," whereas high voltage switching transistor component Q1-HV is implemented using a high-voltage normally-on transistor coupled to a drive signal VN that produces a control voltage to turn high voltage switching transistor component Q1-HV "off."

Figure 2B:
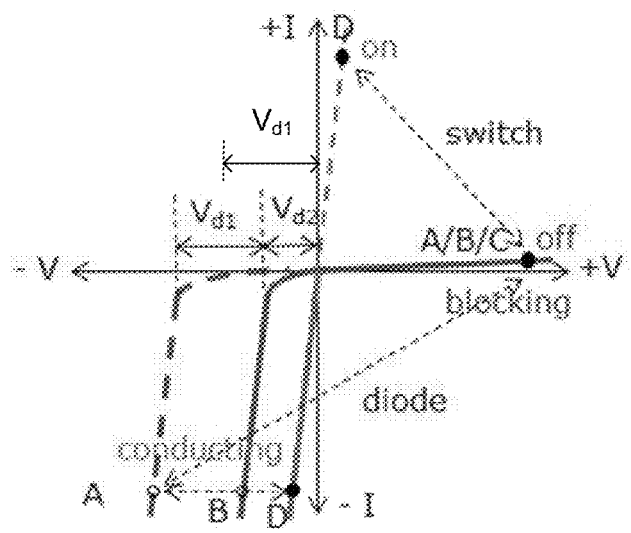

FIG. 2b illustrates an I/V plot of various modes of operation for generalized composed power transistor Qsc. Trace A corresponds to the case in which the control nodes of both high voltage switching transistor component Q1-HV and low voltage switching transistor component Q2-LV are configured to be turned "off" in first quadrant operation. As shown, in FIG. 2b, however, when a reverse voltage is applied across power transistor Qsc, the resulting reverse voltage is equal to the sum of the body diode voltage of each switching transistor component: diode voltage $V_{d1}$ for high voltage switching transistor component Q1-HV and diode voltage $V_{d2}$ for low voltage switching transistor component Q2-LV.

Trace B corresponds to the case in which high voltage switching transistor component Q1-HV is turned "on" and low voltage switching transistor component Q2-LV turned "off" in first quadrant operation. Thus, the series combination of the high voltage switching transistor component Q1-HV and low voltage switching transistor component Q2-LV blocks current in the first quadrant corresponding to a forward direction. In the reverse direction, however, the reverse voltage corresponds to the diode voltage $V_{d2}$ for low voltage switching transistor component Q2-LV in the third quadrant of operation.

Trace C corresponds to the case in which high voltage switching transistor component Q1-HV is turned "off" and low voltage switching transistor component Q2-LV turned "on" in the first quadrant operation. When a reverse voltage is applied across power transistor Qsc, the resulting reverse voltage is equal to diode voltage $V_{d1}$ for high voltage switching transistor component Q1-HV.

Lastly, trace D corresponds to the case in which the control nodes of both high voltage switching transistor component Q1-HV and low voltage switching transistor component Q2-LV are configured to be turned "on" in both first and third quadrant operation.

In an embodiment, the basic switching function of generalized composed power transistor Qsc takes place in the first quadrant of the I/V characteristics, that is, the voltage and current of generalized composed power transistor Qsc stay at one polarity, as represented in the first quadrant of the IV plot shown in FIG. 2b. In many applications, such as switched-mode power supplies, generalized composed power transistor Qsc may also be operated in the third quadrant of FIG. 2b, that is, with a reversed voltage and current polarity. While many transistor switches are not configured to block high reverse voltages, these transistor switches may be utilized as an ideal diode that conducts current in the reverse direction. As shown in FIG. 2b, the voltage drop of such a diode for a given current depends on the control status of the respective transistor. For example, in the "on" state a very low voltage drop can be achieved, as shown with respect to trace D in FIG. 2b. However, in various embodiments, generalized composed power transistor Qsc stays in an "off" state for a certain period of time when it transitions from the first quadrant to the third quadrant to avoid excessive power dissipation caused by two conducting power devices. This period of time in which generalized composed power transistor Qsc stays in an "off" state may be referred to as a "dead time."

Figures 2C, 3A:
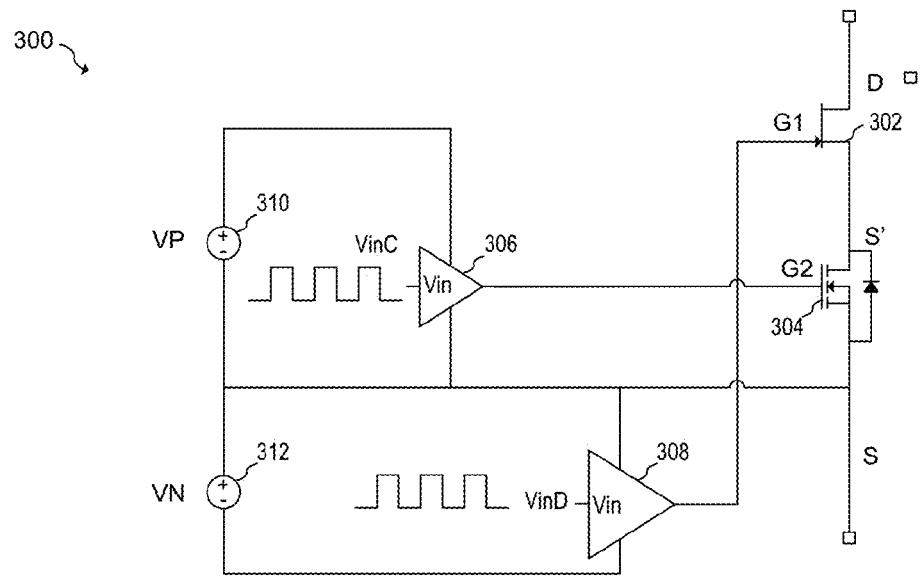
FIGS. 3a to 3d illustrate embodiment compound switch circuits and an associated timing diagram.

FIG. 2c illustrates a table that summarizes the various modes A, B, C and D in which generalized composed power transistor Qsc may operate as described above. Accordingly there is one "on" state D in which power transistor Qcs operates in the forward direction and three "off" states in which power transistor Qsc blocks current in the forward direction and conducts in the reverse direction. In all cases, the reverse voltage at which power transistor Qsc conducts depends on which state A, B, C or D is selected.

The small resistive voltage drop in "on" state is increased by an additional state-dependent voltage $\Delta V_{dio}$ in the "off" states as shown in the table of FIG. 2c. In embodiments in which low voltage switching transistor component Q2-LV is implemented as an enhancement-mode MOSFET, low voltage switching transistor component Q2-LV includes a physical body diode having a reverse diode voltage $V_{d2}$ of approximately 0.8V in some embodiments. Other reverse voltages are possible depending on that particular structure of low voltage switching transistor component Q2-LV. In embodiments in which high voltage switching transistor component Q1-HV is implemented using a GaN HEMT, the reverse voltage drop $V_{d1}$ is given by the voltage difference of threshold $V_{th}$ and negative gate drive level VN, i.e. $V_{d1}=V_{th}-VN$.

In embodiments of the present invention, power transistor Qsc is turned off by transitioning from state D to state A while power transistor Qsc conducts reverse current. In other words, the power transistor is operated as a diode in state D and then both normally-on transistor Q1 and normally-off transistor Q2 is turned off at the same time to transition power transistor Qsc to state A.

FIG. 3a illustrates driver system 300 configured to implement embodiment switching methods. As shown, driver system 300 includes driver circuit 306 having an output coupled to gate connection G2 of normally-off transistor 302 and driver circuit 308 having an output coupled to gate connection G1 of normally-on transistor 302. The positive node supply of negative power supply 312, the negative node of positive power supply 310, the negative supply of driver circuit 306 and the positive supply of driver circuit 308 are all coupled to source S of normally-off transistor 304. Driver circuits 306 and 308 may be implemented using gate driver circuits known in the art. For example, a Texas Instruments UCC 275x or an Infineon Technologies 2EDN752x driver may be used to implement driver circuits 306 and 308 in some embodiments.

During operation, normally-off transistor 304 is turned on by applying positive voltage VP of power supply 310 to its gate connection G2 via driver 306 and is turned-off by coupling gate connection G2 of normally-off transistor 304 to its source node S. Normally-on transistor 302 is turned on by applying the potential at source node S of normally-off transistor 304 to gate connection G1 of normally-on transistor 302. Normally-on transistor 302 is turned off by applying negative voltage VN of power supply 312 between its gate connection G1 and source S. As shown, switching signals VinC and VinD are applied to the input of drivers 306 and 308, respectively.

In an embodiment, voltages VP and VN of power supplies 310 and 312 are set according to the threshold voltages of normally-off transistor 304 and normally-on transistor 302 respectively. In one example, for driver system 300, the voltage VP of power supply 310 is between about 5 V and about 12 V; and the voltage VN of power supply 312 is between about 10 V and about 15 V. In alternative embodiments, different voltages may be used. For example, in some embodiments, voltage VN of power supply 312 may be configured to reduce the gate drive voltage at node G1 without completely shutting off normally-on transistor 302 and/or without providing voltage margin below the threshold of normally-on transistor 302. For example, in some embodiments, voltage VN is substantially equal to the threshold voltage of normally-on transistor 302.

Power supplies 310 and 312 may be implemented using DC power supply systems and methods known in the art. For example, these power supplies may be implemented using the secondary or auxiliary winding of a transformer in a switched mode power supply along with a diode and/or synchronous rectifier. In some embodiments, voltages VP and/or VN may be further regulated using, for example, a linear voltage regulator. Alternatively, other known power supply schemes may be used.

Figure 3B:
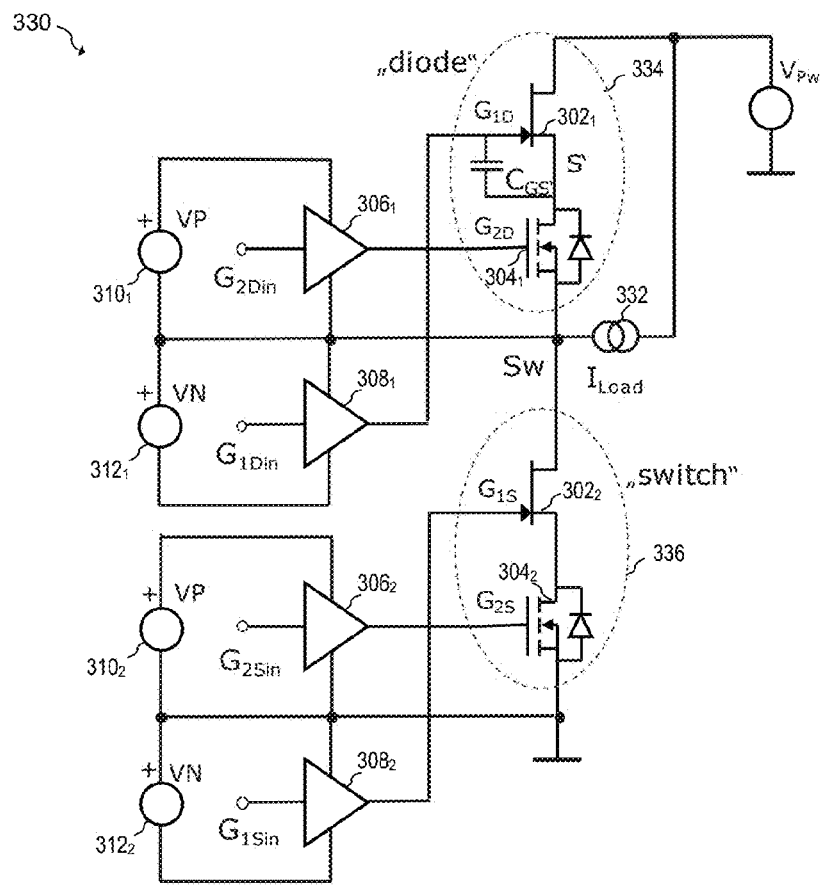

FIG. 3b illustrates an embodiment half-bridge switching circuit 330 that includes a high-side switch 334 that includes normally-off transistor $304_1$ coupled in series with normally-on transistor $302_1$ and a low-side switch 336 that includes normally-off transistor $304_2$ coupled in series with normally-on transistor $302_2$. The gates of normally-off transistor $304_1$ and normally-on transistor $302_1$ are driven by driver circuits $306_1$ and $308_1$, respectively, that are powered by positive voltage supply $310_1$ and negative voltage supply $312_1$. Similarly, the gates of normally-off transistor $304_2$ and normally-on transistor $302_2$ are driven by driver circuits $306_2$ and $308_2$, respectively, that are powered by positive voltage supply $310_2$ and negative voltage supply $312_2$.

In an embodiment, the high-side switch 334 is operated with a diode functionality and low-side switch 336 is operated with a switch functionality, for example in a boost configuration. Alternatively, high-side switch 334 may be operated with a switch functionality and low-side switch 336 may be operated with a diode functionality. In some cases, the diode and switch functionality may alternate between high-side switch 334 and low-side switch 336 in order to perform full-wave rectification. Current source 332 driving load current $I_{Load}$ represents an inductive load.

If high-side switch were operating in a cascode mode in which normally-off transistor $304_1$ controls switch state, the gate-source capacitance CGS of normally-on transistor $302_1$ and the drain-source capacitance of normally-off transistor $304_i$ would be charged by the switch current conducted by low-side switch 336, when the load current $I_{Load}$ is commutated from the high-side "diode" 334 to the low-side switch 336. This charging current flows through high supply voltage $V_{Pw}$ and may cause significant power loss.

Figure 3C:
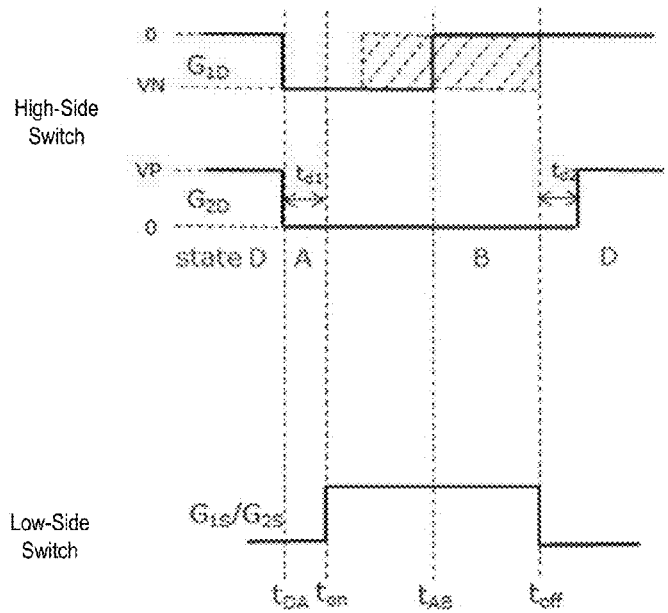

In embodiments of the present invention, the effect of this power loss may be reduced by charging the gate-source capacitance CGS of normally-on transistor $302_1$ to the negative supply VN of gate driver $308_1$ before the low-side switch 336 turns-on, as can be seen in the timing diagram of FIG. 3c, which indicates that normally-on transistor $302_1$ and normally-off transistor $304_1$ are turned off simultaneously at time $t_{D4}$ prior to low-side switch 336 being turned on at time $t_{on}$ This corresponds to a direct transition from state D to state A. In various embodiments, capacitances of high-side switch 334 are charged by gate driver circuit $308_1$ instead of by a high-voltage power supply $V_{Pw}$ to achieve lower power loss and lower voltage stress on the devices of high-side switch 334. In some embodiments, voltage VN of power supply $312_1$ may be configured to reduce the gate drive voltage at node $G_{1D}$ without completely shutting off normally-on transistor $302_1$ and/or without providing voltage margin below the threshold of normally-on transistor $302_1$. This reduction in the gate drive voltage effectively reduces the transconductance of normally-on transistor $302_1$ For example, in some embodiments, voltage VN is substantially equal to the threshold voltage of normally-on transistor $302_1$. In such embodiments, the reduced gate drive to transistor $302_1$ is sufficient to prevent power loss caused by the charging and discharging of CGS of normally-on transistor $302_1$.

In some embodiments, there is a dead-time $t_{d1}$ between turning off the high-side switch 334 and turning on the low-side switch 336 to prevent shoot-through current. In the illustrated example of FIG. 3c, normally-on transistor $302_1$ is turned-on again at time $t_{AB}$, thereby placing high-side switch 334 in state B to reduce the reverse voltage during dead time $t_{d2}$ between switching off the switch at time $t_{off}$ and switching on normally-off transistor $304_1$. In various embodiments, the control of low-side switch 336 may be achieved in various modes, for example, a directly driven mode in which normally-off transistor $304_2$ remains on while normally-on transistor $302_2$ is switched, a cascode mode in which normally-on transistor $302_2$ remains on and normally-off transistor $304_2$ is switched, or a mode in which normally-on transistor $302_2$ and normally-off transistor $304_2$ are switched on simultaneously. The selection of which of these modes are used may be made according to the particular application and its specifications.

Figure 3D:
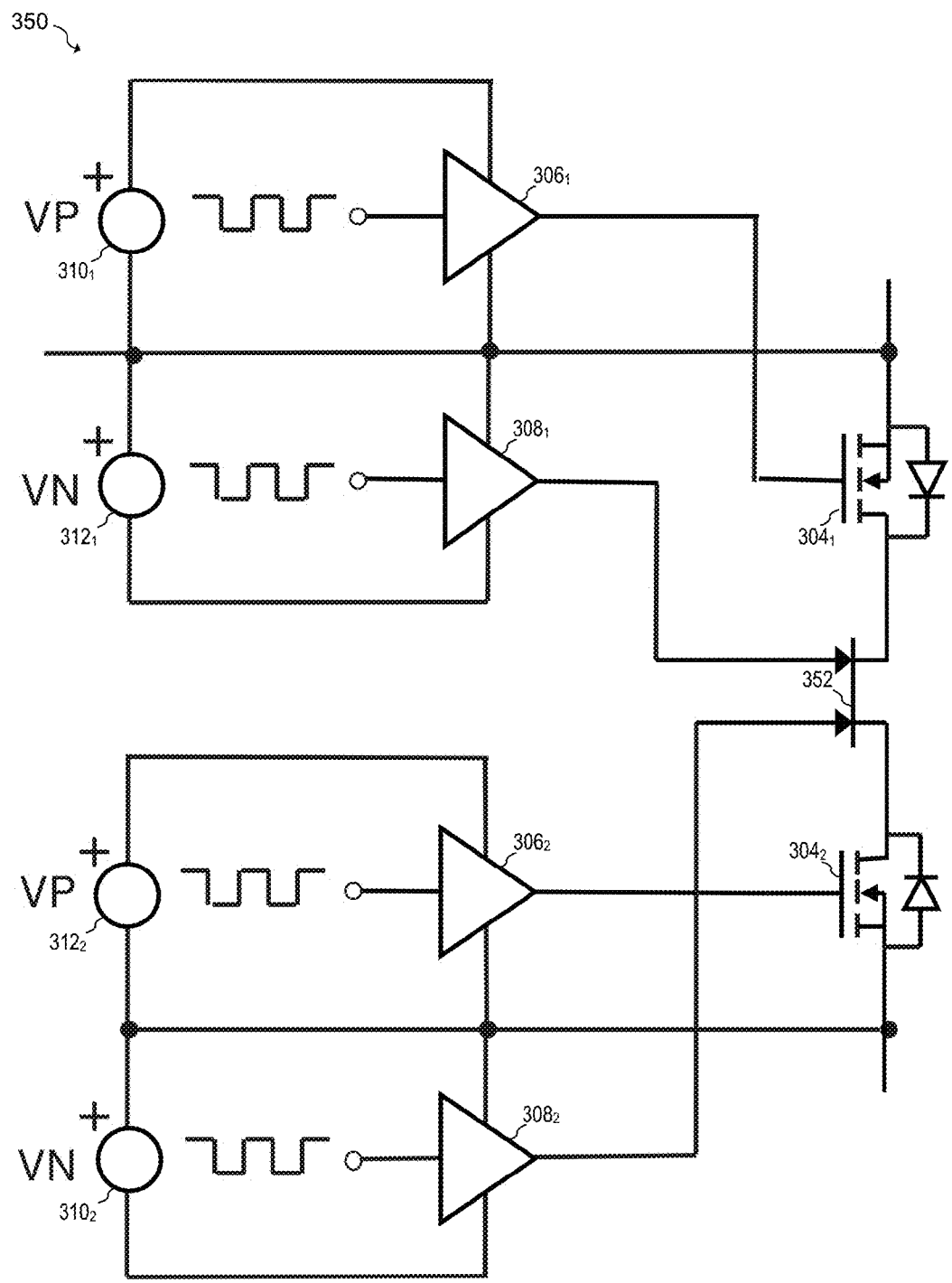

FIG. 3d illustrates compound switch 350 according to an alternative embodiment of the present invention that utilizes a dual gate GaN HEMT device 352 coupled in series with normally-off transistors $304_1$ and $304_2$. During operation, the gates of normally-off transistor $304_1$ and normally-off transistor $304_2$ are driven by driver circuits $306_1$ and $306_2$, respectively. Similarly, the two gates of GaN HEMT device 352 are driven by driver circuits $308_1$ and $308_2$, respectively. Operation proceeds according to the embodiment of FIGS. 3b and 3c as described above. In various embodiments, compound switch 350 is capable of blocking voltages and conducting currents in both directions.

Figure 4A:
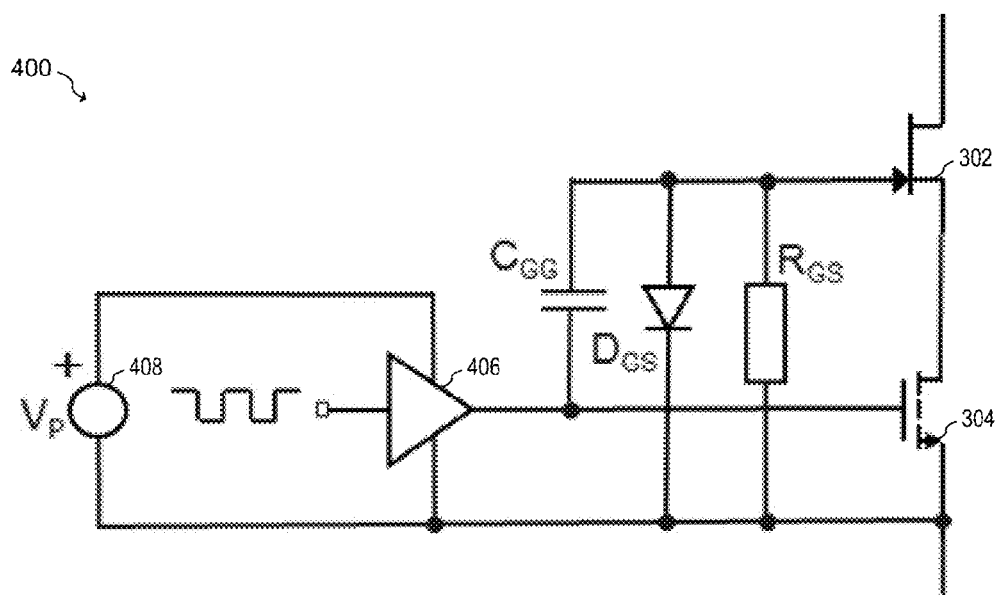
FIGS. 4a, 4b and 4c illustrate embodiment compound switch circuits.

FIG. 4a illustrates an embodiment switching circuit 400 in which both normally-on transistor 302 and normally-off transistor are driven using the same driver circuit 406. As shown, the output of driver circuit 406 is connected to the gate of normally-off transistor 304, and is coupled to the gate of normally-on transistor 302 via capacitor $C_{GG}$. During operation, when the output of driver circuit 406 is pulled high to voltage VP produced by power supply 408, the gate of normally-on transistor 302 is clamped to source by diode $D_{GS}$ and thus $C_{GG}$ is charged to the positive drive voltage VP.

When the output of gate driver 406 transitions from a high state to a low state, for example, from a voltage of about VP to zero volts, the voltage at the gate of normally-on transistor 302 is pulled from about zero volts to about −VP volts via capacitor $C_{GG}$. The applied negative voltage can be below or above the threshold of normally-on transistor 302. In addition, when high-side transistor 302 is turned-off, diode $D_{GS}$ is reversed-bias, which prevents capacitor $C_{GG}$ from being rapidly discharged. Discharging of $C_{GG}$ is controlled by time constant $C_{GG}*R_{GS}$. Besides, resistor $R_{GS}$ provides a substitute for the original characteristic cascode connection. Thus, with respect to static behavior and safety, both circuits behave similarly. By using a single gate driver circuit 406, both normally-on transistor 302 and normally-off transistor 304 having different threshold voltages may be simultaneously driven. In some embodiments the function of diode $D_{GS}$ may be implemented by other circuits that perform a clamping function. For example, a switch that is configured to turn-on when the voltage between nodes $G_{1D}$ and Sw is positive and turn-off when the voltage between nodes $G_{1D}$ and Sw is negative may be used in place of or in addition to diode $D_{GS}$. In further embodiments, other circuit components may be used.

Figure 4B:
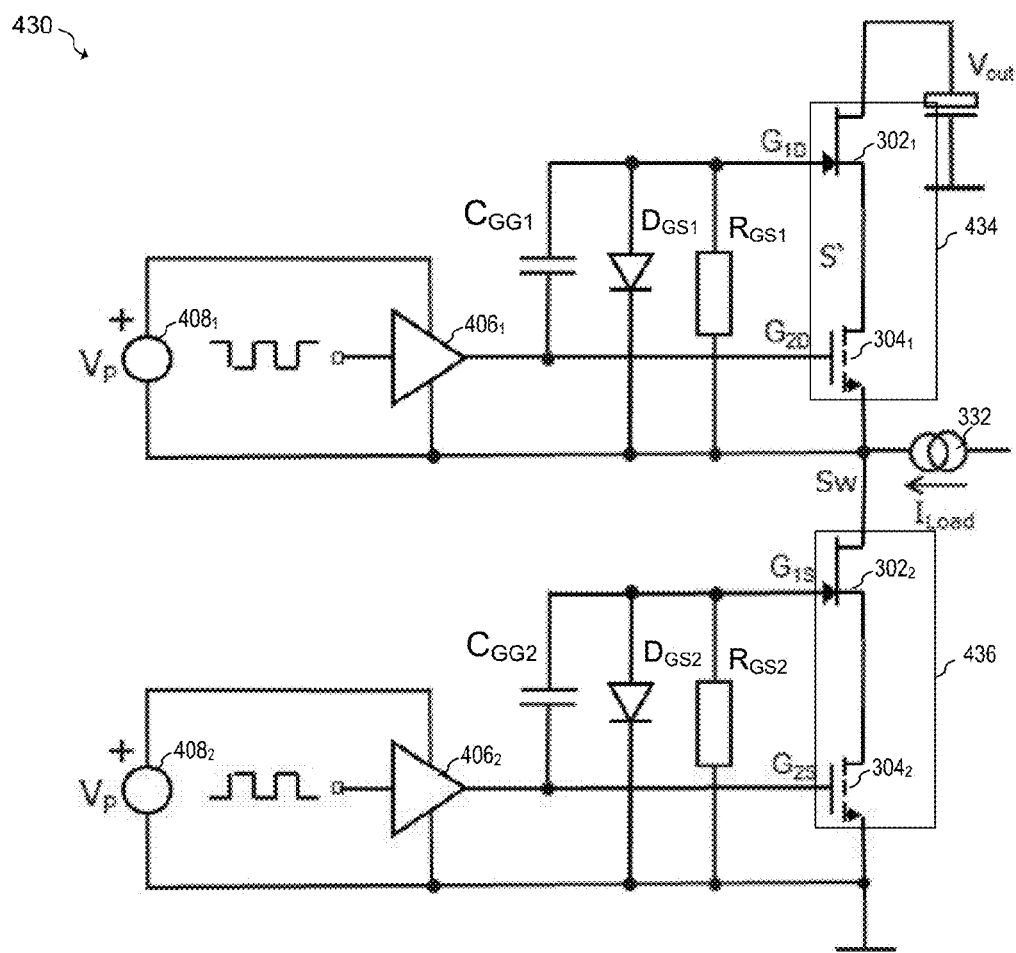

FIG. 4b illustrates an embodiment half-bridge switching circuit 430 that utilizes embodiment switching circuit 400 shown in FIG. 4a. Half-bridge switching circuit 430 includes a high-side switch 434 that includes normally-off transistor $304_1$ coupled in series with normally-on transistor $302_1$ and a low-side switch 436 that includes normally-off transistor $304_2$ coupled in series with normally-on transistor $302_2$. The gate node $G_{2D}$ of normally-off transistor $304_1$ is driven by driver circuit $406_1$, and the gate node $G_{1D}$ of normally-on transistor $302_1$ is driven by driver circuit $406_1$ via capacitor $C_{GG1}$ as described above with respect to embodiment switching circuit 400. Diode $D_{GS1}$ and resistor $R_{GS1}$ are coupled between gate node $G_{1D}$ and source node Sw to clamp gate node $G_{1D}$ to source Sw prior to normally-on transistor $302_1$ being switched off. Similarly, the gate node $G_{2S}$ of normally-off transistor $304_2$ is driven by driver circuit $406_2$, and the gate node $G_{1S}$ of normally-on transistor $302_2$ is driven by driver circuit $406_2$ via capacitor $C_{GG2}$ as described above with respect to embodiment switching circuit 400. Diode $D_{GS2}$ and resistor $R_{GS2}$ are coupled between gate nodes $G_{1S}$ and ground to provide a bias voltage to gate node $G_{1S}$ prior to normally-on transistor $302_2$ being switched off. In an embodiment, driver circuits $406_1$ and $406_2$ are powered by power supplies $408_1$ and $408_2$, respectively.

In one example embodiment, the normally-on transistors $302_1$ and $302_2$ are implemented using a 650 V/100 mΩ GaN HEMT having a threshold voltage of about −7V and normally-off transistors $304_1$ and $304_2$ are implemented using a 30 V/2 mΩ enhancement mode n-channel MOSFET. $C_{GG}$ is 3 nF and $R_{GS}$ is 500Ω. It should be understood that in alternative embodiments of the present invention, other component types and values may be used depending on the particular embodiment and its specifications.

Figure 4C:
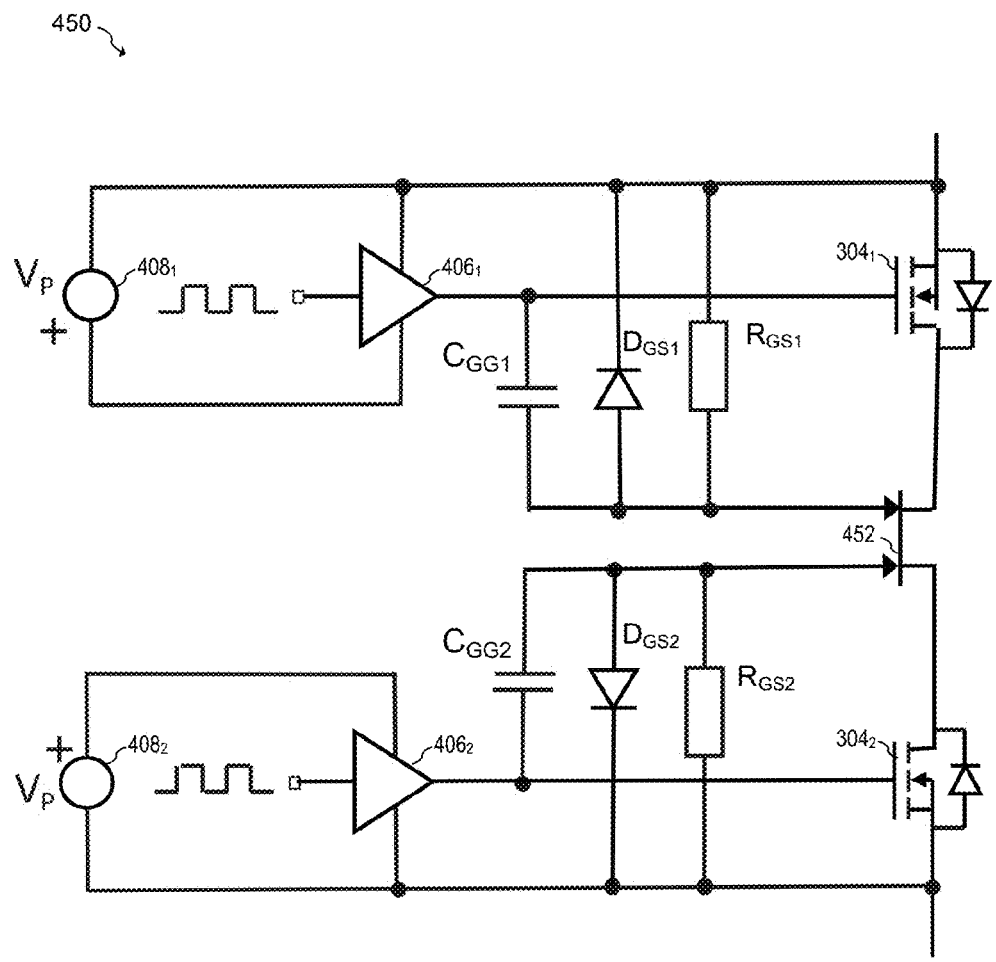

FIG. 4c illustrates compound switch 450 according to an alternative embodiment of the present invention that utilizes a dual gate GaN HEMT device 452 coupled in series with normally-off transistors $304_1$ and $304_2$. As shown, one gate of GaN HEMT device 452 is interfaced to the output of driver circuit $406_1$ via capacitor $C_{GG1}$, $D_{GS1}$ and $R_{GS1}$, and the other gate of GaN HEMT device 452 is interfaced to the output of driver circuit $406_2$ via capacitor $C_{GG2}$, $D_{GS2}$ and $R_{GS2}$. During operation, the gates of normally-off transistor $304_1$ and normally-off transistor $304_2$ are driven by driver circuits $406_1$ and $406_2$, respectively. The gates of GaN HEMT device 452 are bootstrapped by their respective capacitors $C_{GG1}$ and $C_{GG2}$ as described above with respect to the embodiments of FIGS. 4a and 4b. In various embodiments, compound switch 450 is capable of blocking voltages and conducting currents in both directions.

Figure 5A:
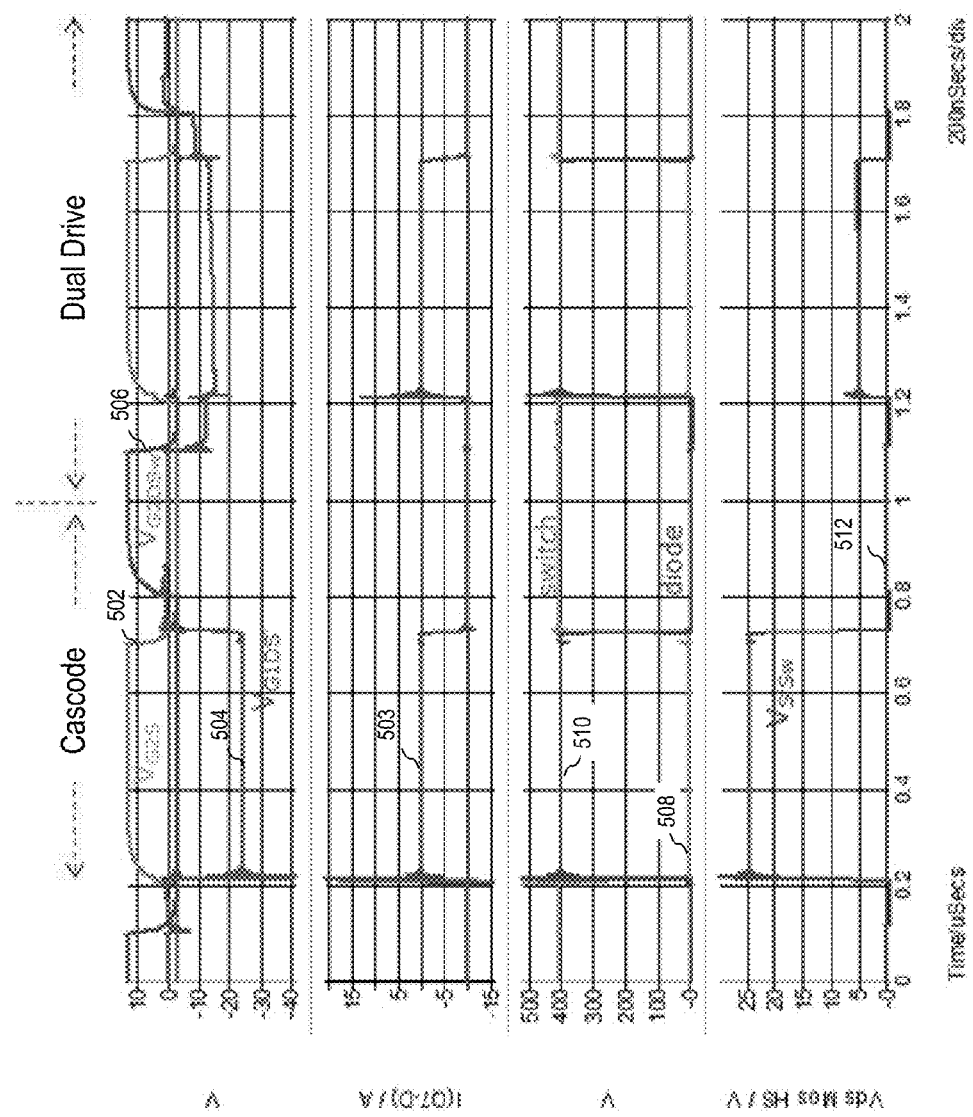
FIGS. 5a and 5b illustrate waveform diagram of embodiment compound switch circuits.

FIG. 5a illustrates a waveform diagram of a simulation of the embodiment half-bridge switching circuit 430 shown in FIG. 4b. The left side of the waveform diagram represents the performance of the circuit when it is driven in a cascode mode of operation, i.e. with $R_{GS}$=0, while the right side of the diagram represents the performance of the circuit when it is driven in an embodiment dual-drive mode of operation. On the first axis, the gate-source voltage of high-side normally-off transistor $304_1$ is shown as trace 502 and the gate-source voltage of low-side normally-off transistor $304_2$ is shown as trace 506. The gate-source voltage of high-side normally-on transistor is depicted as trace 504. On the second axis, the current through high-side switch 434 is represented as trace 503, and on the third axis the voltages across high-side switch 434 and low-side switch 436 are represented as traces 510 and 508, respectively. The drain-source voltage of normally-off transistor $304_1$ (implemented as a MOSFET for this simulation) is represented as trace 512 on the fourth axis.

As shown with respect to trace 503 that represents the current though high-side switch, a current transient of about 20 A flows through high-side switch 434 during the "on"-transient at about 0.2 μs in the simulation when switch 434 is in the cascode mode ($R_{GS}$=0). By comparison, the current transient though the high-side switch is less than 15 A when switch 434 is activated in an embodiment dual drive mode indicating lower power consumption at about 1.2 us into the simulation. As is further shown with respect to trace 512, the drain-source voltage of normally-off transistor $304_1$ in high-side switch 434 is about 25 V during the cascode mode of operation. By contrast, the drain-source voltage of normally-off transistor $304_1$ in high-side switch 434 is only about 5 V during the embodiment dual-drive of operation indicating that less voltage stress is applied to the device.

Figure 5B:
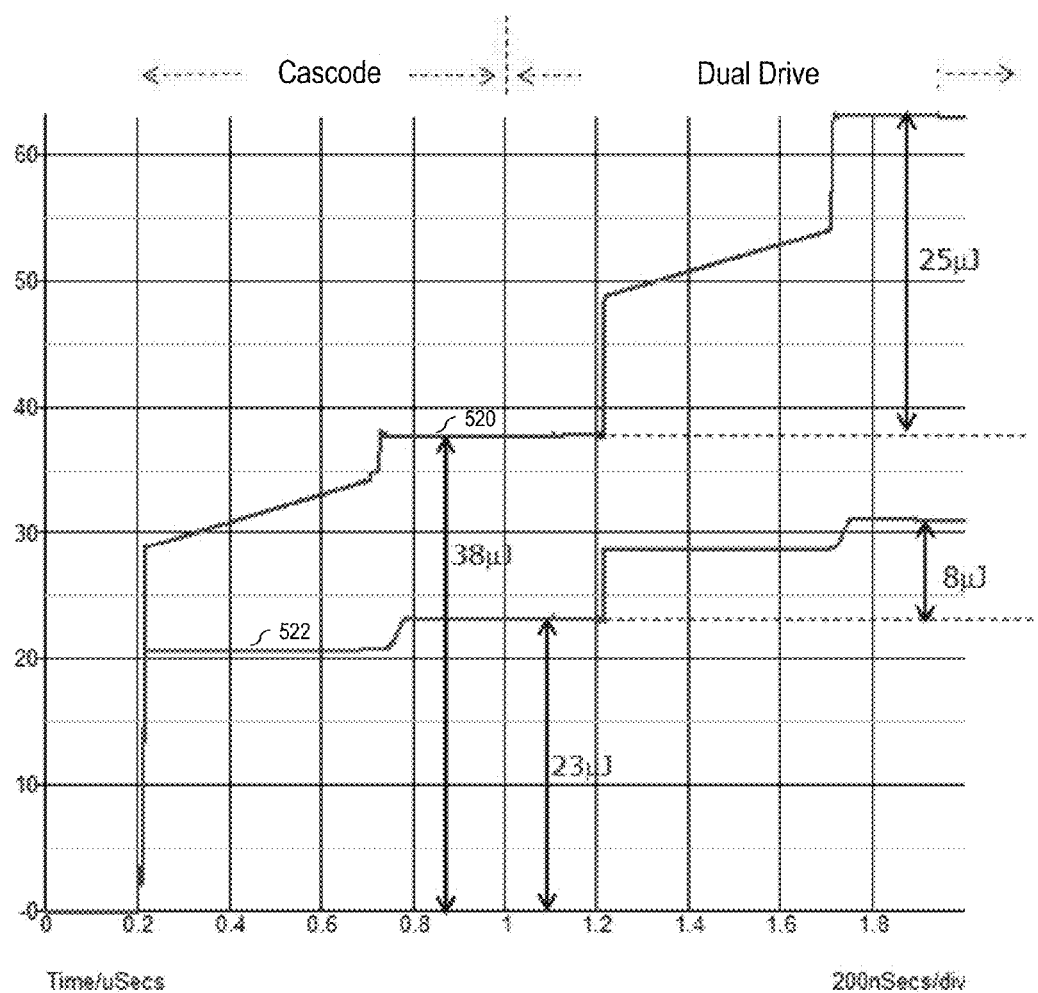

FIG. 5b illustrates a waveform diagram showing a simulated energy consumption of the embodiment half-bridge switching circuit 430 shown in FIG. 4b. The left side of the waveform diagram represents the energy consumption of the circuit when it is driven in a cascode mode of operation, while the right side of the diagram represents the energy consumption of the circuit when it is driven in an embodiment dual-drive mode of operation. Trace 520 represents the energy consumption of switch 434 with a load current of 10 A and trace 522 represents the energy consumption of switch 434 with a load current of 1 A. The time axis corresponds with the waveform diagram of FIG. 5a.

As shown with respect to trace 520 representing energy consumption of switch 434 at 10 A of load current, at about 0.2 μs, about 29 μJ of energy is dissipated due to the "on"-transient. Between about 0.2 μs and about 0.7 μs an additional 6 μJ is consumed due to conduction losses, and at 0.7 μs, another 3 μJ of energy is dissipated due to switching losses for a total of 38 μJ of energy consumed when high-side switch 434 operates in a cascode mode of operation. In contrast, during the embodiment dual drive mode of operation, about 10 μJ is consumed due to current transients at about 1.2 μs into the simulation. Between about 1.2 μs and about 1.7 μs, 6 A is consumed due to conduction losses, and at 1.7 ρs, another 9 μJ of energy is dissipated due to switching losses for a total of 25 μJ of energy. Hence, the embodiment dual drive switching scheme consumes about 44% less energy than the cascode switching scheme with a 10 A load current.

As shown with respect to trace 522 representing energy consumption at 1 A of load current, at 0.2 μs, about 21 μJ of energy is dissipated due to a current transient in high-side switch 434 and at 0.7 μs, another 3 μJ of energy is dissipated due to switching losses for a total of 23 μJ of energy consumed when high-side switch 434 operates in a cascode mode of operation. Because of the lower load current, the conduction losses are negligible. In contrast, during the embodiment dual drive mode of operation, about 5 μJ is consumed due to current transients at about 1.2 μs in the simulation and at 1.7 μs, another 3 μJ of energy is dissipated due to switching losses for a total of 8 μJ of energy. Hence, the embodiment dual drive switching scheme consumes about 65% less energy than the cascode switching scheme with a 1 A load current.

Figure 6:
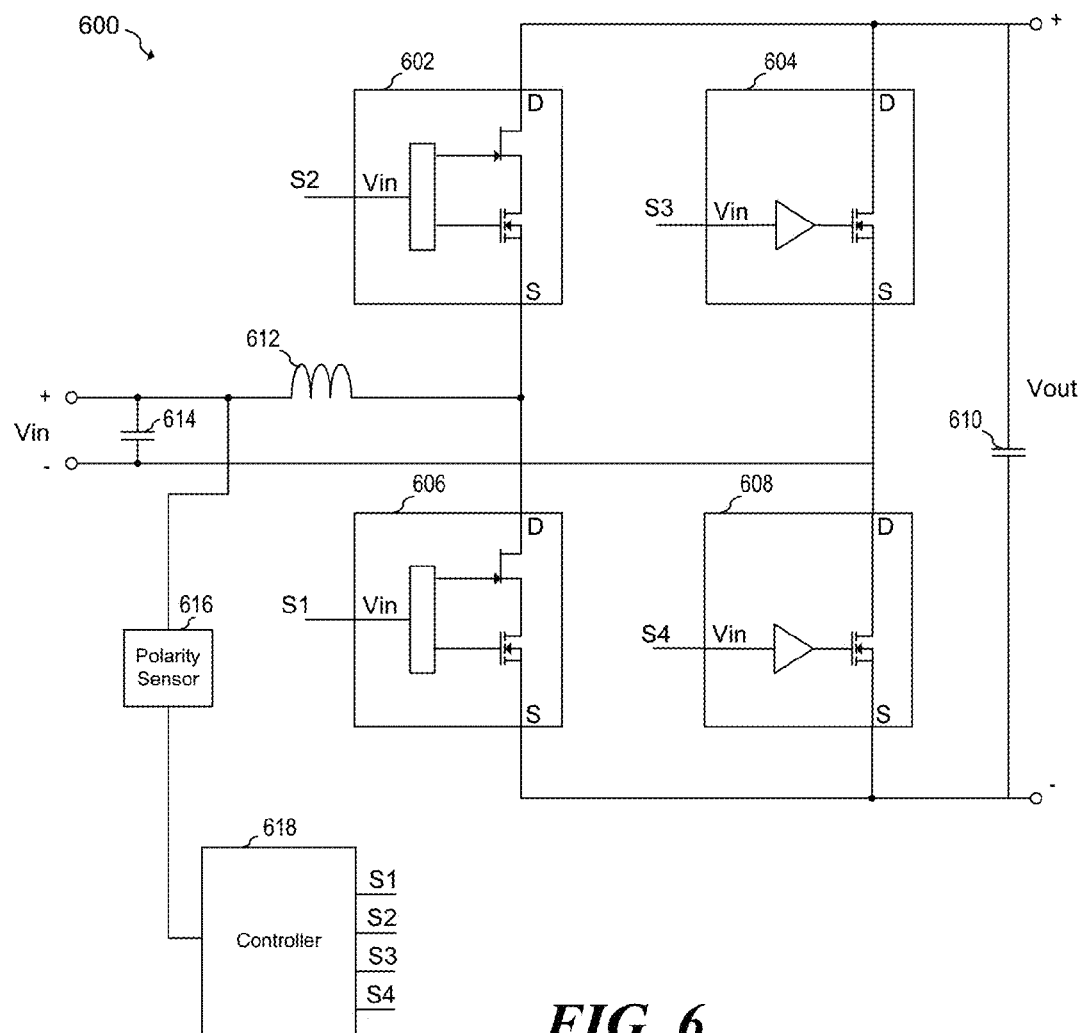
FIG. 6 illustrates an embodiment switched-mode power supply.

FIG. 6 illustrates switched-mode power converter 600 according to an embodiment of the present invention that is configured to convert an AC input signal, such as a 50 Hz to 60 Hz line voltage at input port Vin, to a DC output voltage at output port Vout. For example, in one embodiment, switched-mode power converter 600 is configured to convert a 120 VAC or 240 VAC input 50 Hz to 60 Hz power line input voltage to a DC output voltage of about 400 V. Alternatively, other input and voltages operated at the same or different frequency ranges may be used.

Switched-mode power converter 600 includes an H-bridge implemented using embodiment dual drive compound switch and drivers 602 and 606 according to embodiments described herein. This H-bridge is coupled to input port Vin via inductor 612. During operation of switched-mode power converter 600, compound switch and drivers 602 and 606 magnetize and demagnetize inductor 612 such that power is transferred from input port Vin to output port Vout. Switching circuits 604 and 608 that include MOSFET switching transistors are operated as synchronous rectifiers that provide a return current path and may also be implemented using diodes in some embodiments. Capacitor 614 represents the input capacitance of switched-mode power converter 600 and capacitor 610 represents the load capacitance of switched-mode power converter 600. Each embodiment compound switch and driver 602 and 606 includes a normally-on transistor coupled in series with a normally-off transistor and is configured to receive a switching signal at input pin Vin. In an embodiment, controller 618 provides switching signals to embodiment compound switch and drivers 602 and 606 and to switching circuits 604 and 608, the timing of which are configured to convert an AC input signal at input port Vin to a DC output signal at port Vout.

Controller 618 may be implemented using an H-bridge-based switched mode power controller known in the art. Such controllers may include analog controller that incorporate analog PWM generation circuitry and/or a digital controller that is implemented using a dedicated digital logic, a processor such as a microprocessor or a microcontroller and/or a combination thereof. In some embodiments, controller 618 may utilize current and/or voltage feedback from various nodes and current branches of switched-mode power converter 600 in order to provide feedback control of the output voltage, output current, and/or input currents. For example, the switching of signals S1, S2 coupled to compound switch and drivers 606 and 602 and signals S3 and S4 coupled to switching circuits 604 and 608 may be configured to provide a controlled output voltage and a controlled input current such that power factor correction is achieved.

In some embodiments, compound switch and driver 602 may be operated with diode functionality and compound switch and driver 606 may operate with switch functionality during half-cycles of one polarity, and compound switch and driver 602 may be operated with diode functionality and compound switch and driver 606 in half-cycles of the opposite polarity in order to achieve full-wave rectification. In such embodiments, polarity sensor 616 senses the polarity of Vin and causes controller 618 to control compound switch and drivers 602 and 606 to provide switching signals S1 and S2 that operate according to these alternating switch and diode modes.

Embodiment switch drivers may also be applied to other circuits besides half-bridge driving circuits. For example, embodiment switch drivers may be applied in a symmetric manner to drive bidirectional GaN switches with two gate connections, as mentioned above with respect to FIGS. 3d and 4c.

Figure 7:
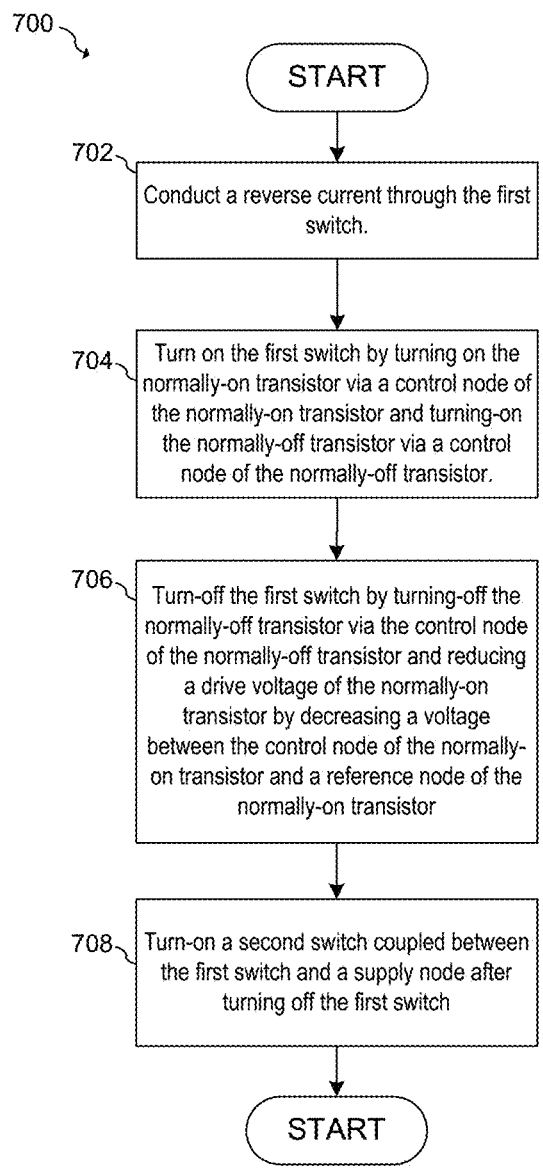
FIG. 7 illustrates a flowchart of an embodiment method.

FIG. 7 illustrates a flowchart of an embodiment method 700 of operating a first switch coupled between a first switch node and a second switch node, where the first switch includes a normally-on transistor coupled in series with a normally-off transistor according to embodiments described herein. In step 702, a reverse current is conducted through the first switch. In step 704, the first switch is turned-on by turning on the normally-on transistor via a control node of the normally-on transistor and turning-on the normally-off transistor via a control node of the normally-off transistor. In various embodiments, the reverse current corresponds to a positive voltage between the second switch node and the first switch node.

In step 706, while conducting the reverse current, the first switch is turned-off by turning-off the normally-off transistor via the control node of the normally-off transistor and reducing a drive voltage of the normally-on transistor by decreasing a voltage between the control node of the normally-on transistor and a reference node of the normally-on transistor. After the first switch is turned-off, a second switch coupled between the first switch an a supply node is turned-on in step 708.

Embodiments of the present invention are summarized here. Other embodiments can also be understood form the entirety of the specification and the claims filed herein. One general aspect includes a method of operating a first switch coupled between a first switch node and a second switch node, the first switch including a normally-on transistor coupled in series with a normally-off transistor. The method includes turning-on the first switch by turning on the normally-on transistor via a control node of the normally-on transistor and turning-on the normally-off transistor via a control node of the normally-off transistor; conducting a reverse current through the first switch, where the reverse current corresponds to a positive voltage between the second switch node and the first switch node. While conducting the reverse current, the first switch is turned off by turning-off the normally-off transistor via the control node of the normally-off transistor and reducing a drive voltage of the normally-on transistor by decreasing a voltage between the control node of the normally-on transistor and a reference node. A second switch coupled between the first switch and a supply node is turned on after turning off the first switch.

Implementations may include one or more of the following features. The method where the second switch is coupled between the second switch node and the supply node. The method where turning-off the normally-off transistor and reducing the drive voltage of the normally-on transistor are performed at substantially the same time. In some embodiments, the reference node of the normally-on transistor is a source node of the normally-off transistor, the second switch node is a source node of the normally-off transistor, and the first switch node is a drain node of the normally-on transistor.

The normally-on transistor may include a first n-channel device and the normally-off transistor includes a second n-channel device. In some embodiments, the normally-on transistor is a gallium nitride (GaN) high electron mobility transistor (HEMT), and the normally-off transistor is an enhancement mode MOSFET.

In an embodiment, turning-off the normally-off transistor includes driving the control node of the normally-off transistor from a first voltage to a second voltage using a first driving circuit; and reducing the drive voltage of the normally-on transistor includes driving the control node of the normally-on transistor with a capacitor having a first terminal coupled to the control node of the normally-off transistor and a second terminal coupled to the control node of the normally-on transistor. Turning on the normally-off transistor via the control node of the normally-off transistor may include driving the control node of the normally-off transistor from the second voltage to the first voltage; and turning on the normally-on transistor via a control node of the normally-on transistor may include driving the control node of the normally-on transistor using a clamp circuit coupled between the control node of the normally-on transistor and a source node of the normally-off transistor. In some embodiments, the clamp circuit includes a diode coupled between the control node of the normally-on transistor and the source node of the normally-off transistor.

In an embodiment, turning-on the first switch, turning-off the normally-off transistor and reducing the drive voltage of the normally-on transistor is performed in response to a switching signal. Conducting the reverse current may include sourcing the reverse current using an inductor, and the method may further include magnetizing the inductor before sourcing the reverse current. Magnetizing may be performed by applying a first voltage across the inductor using a second switch coupled to the inductor and to the first switch.

In an embodiment, turning-off the normally-off transistor includes driving the control node of the normally-off transistor from a first voltage to a second voltage using a first driving circuit; and reducing the drive voltage of the normally-on transistor includes decreasing the drive voltage from a third voltage to a fourth voltage using a second driving circuit. The fourth voltage may be below a turn-on threshold of the normally-on transistor, however, in other embodiments, the fourth voltage is not below a turn-on threshold of the normally-on transistor. The first switch and the second switch are arranged in a half-bridge configuration in some embodiments, and in some embodiments, turning on the second switch further includes turning on the second switch a first period of time after turning off the first switch.

Another general aspect includes a circuit including a first driver terminal configured to be coupled to a control node of a normally-off transistor coupled in series with a normally-on transistor, where the normally-off transistor and the normally-on transistor form a first switch coupled between a first switch node and a second switch node; a second driver terminal configured to be coupled to a control node of a normally-on transistor; a third driver terminal configured to be coupled to a control node of a second switch coupled between the first switch and a supply node; and a driver circuit. The driver circuit is configured to: turn-on the normally-off transistor via the first driver terminal and turn-on the normally-on transistor via the second driver terminal, when the first switch conducts a reverse current, turn-off the first switch by turning-off the normally-off transistor via the first driver terminal and reducing a drive voltage of the normally-on transistor via the second driver terminal by decreasing a voltage between the control node of the normally-on transistor and a reference node, where the reverse current corresponds to a positive voltage between the second switch node and the first switch node; and turn on the second switch after turning off the first switch.

Implementations may include one or more of the following features. The circuit where the driver circuit is configured to turn-off the first switch by turning-off the normally-on transistor and reducing the drive voltage of the normally-on transistor at substantially the same time. The circuit where the reference node of the normally-on transistor is a source node of the normally-off transistor; the second switch node is a source node of the normally-off transistor; and the first switch node is a drain node of the normally-on transistor.

In some embodiments, the circuit further includes the normally-off transistor and the normally-on transistor and/or the second switch, which may be coupled between the second switch node and the supply node. In an embodiment, the normally-off transistor includes an enhancement mode MOSFET and the normally-on transistor includes a gallium nitride (GaN) high electron mobility transistor (HEMT). The first switch and the second switch may be arranged in a half-bridge configuration.

The driver circuit may include a first driver having an output coupled to the first driver terminal; and a second driver having an output coupled to the second driver terminal. In another embodiment, the driver circuit includes a first driver having an output coupled to the first driver terminal, a capacitor coupled between the first driver terminal and the second driver terminal, and a clamp circuit coupled between the second driver terminal and the second switch node. The clamp circuit may be implemented, for example, using a diode. The circuit may further include a resistor coupled in parallel with the diode.

In an embodiment, the driver circuit reduces the drive voltage to a voltage below a threshold of the normally-on transistor. Alternatively, the driver circuit reduces the drive voltage of the normally-on transistor to a voltage that is not below a threshold of the normally-on transistor.

A further general aspect includes a circuit having a normally-on transistor coupled in series with a normally-off transistor, a gate driving circuit having an output coupled to a control node of the normally-off transistor, a capacitor coupled between the control node of the normally-off transistor and a control node of the normally-on transistor, and a clamp circuit coupled between the control node of the normally-on transistor and the source node of the normally-off transistor.

Implementations may include one or more of the following features. The circuit where the clamp circuit includes a diode and/or further including a resistor coupled between the gate of the normally-on transistor and a source of the normally-off transistor.

Advantages of some embodiments include reduced power consumption and reduced device stress when operating embodiment compound switches in an embodiment dual drive mode. A further advantage of some embodiments includes the ability to drive a compound switch using a single gate driver circuit and a few inexpensive components, thereby resulting in savings in terms of device cost and circuit area.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of operating a first switch coupled between a first switch node and a second switch node, the first switch comprising a normally-on transistor coupled in series with a normally-off transistor, the method comprising:
    conducting a reverse current through the first switch, wherein the reverse current corresponds to a positive voltage between the second switch node and the first switch node, and the reverse current flows from a source node of the normally-on transistor to a drain node of the normally-on transistor;
    turning-on the first switch comprising turning on the normally-on transistor via a control node of the normally-on transistor and turning-on the normally-off transistor via a control node of the normally-off transistor;
    while conducting the reverse current, turning off the first switch comprising turning-off the normally-off transistor via the control node of the normally-off transistor and reducing a drive voltage of the normally-on transistor by decreasing a voltage between the control node of the normally-on transistor and a reference node of the normally-on transistor; and
    turning on a second switch coupled between the first switch and a supply node after turning off the first switch.

2. The method of claim 1, wherein the second switch is coupled between the second switch node and the supply node.

3. The method of claim 1, wherein turning-off the normally-on transistor and reducing the drive voltage of the normally-on transistor are performed at substantially the same time.

4. The method of claim 1, wherein:
    the normally-on transistor comprises a gallium nitride (GaN) high electron mobility transistor (HEMT); and
    the normally-off transistor comprises an enhancement mode MOSFET.

5. The method of claim 1, wherein:
    turning-off the normally-off transistor comprises driving the control node of the normally-off transistor from a first voltage to a second voltage using a first driving circuit; and
    reducing the drive voltage of the normally-on transistor comprises driving the control node of the normally-on transistor with a capacitor having a first terminal coupled to the control node of the normally-off transistor and a second terminal coupled to the control node of the normally-on transistor.

6. The method of claim 5, wherein:
turning on the normally-off transistor via the control node of the normally-off transistor comprises driving the control node of the normally-off transistor from the second voltage to the first voltage; and
turning on the normally-on transistor via a control node of the normally-on transistor comprises driving the control node of the normally-on transistor using a clamp circuit coupled between the control node of the normally-on transistor and a source node of the normally-off transistor.

7. The method of claim 6, wherein the clamp circuit comprises a diode coupled between the control node of the normally-on transistor and the source node of the normally-off transistor.

8. The method of claim 1, wherein turning-on the first switch, turning-off the normally-off transistor and reducing the drive voltage of the normally-on transistor is performed in response to a switching signal.

9. The method of claim 1, wherein:
turning-off the normally-off transistor comprises driving the control node of the normally-off transistor from a first voltage to a second voltage using a first driving circuit; and
reducing the drive voltage of the normally-on transistor comprises decreasing the drive voltage from a third voltage to a fourth voltage using a second driving circuit.

10. The method of claim 9, wherein the fourth voltage is below a turn-on threshold of the normally-on transistor.

11. The method of claim 1, wherein turning on the second switch further comprises turning on the second switch a first period of time after turning off the first switch.

12. A circuit comprising:
a first driver terminal configured to be coupled to a control node of a normally-off transistor coupled in series with a normally-on transistor, wherein the normally-off transistor and the normally-on transistor form a first switch coupled between a first switch node and a second switch node;
a second driver terminal configured to be coupled to a control node of a normally-on transistor;
a third driver terminal configured to be coupled to a control node of a second switch coupled between the first switch and a supply node; and
a driver circuit configured to:
turn-on the normally-off transistor via the first driver terminal and turn-on the normally-on transistor via the second driver terminal,
when the first switch conducts a reverse current, turn-off the first switch by turning-off the normally-off transistor via the first driver terminal and reducing a drive voltage of the normally-on transistor via the second driver terminal by decreasing a voltage between the control node of the normally-on transistor and a reference node, wherein the reverse current corresponds to a positive voltage between the second switch node and the first switch node, and the reverse current flows from a source node of the normally-on transistor to a drain node of the normally-on transistor; and
turn on the second switch after turning off the first switch.

13. The circuit of claim 12, wherein the driver circuit is configured to turn-off the first switch by turning-off the normally-on transistor and reducing the drive voltage of the normally-on transistor at substantially the same time.

14. The circuit of claim 12, wherein:
the reference node of the normally-on transistor is the source node of the normally-off transistor;
the second switch node is a source node of the normally-off transistor;
and the first switch node is the drain node of the normally-on transistor.

15. The circuit of claim 12, further comprising the normally-off transistor and the normally-on transistor.

16. The circuit of claim 15, further comprising the second switch.

17. The circuit of claim 16, wherein the second switch is coupled between the second switch node and the supply node.

18. The circuit of claim 15, wherein:
the normally-off transistor comprises an enhancement mode MOSFET; and
the normally-on transistor comprises a gallium nitride (GaN) high electron mobility transistor (HEMT).

19. The circuit of claim 12, wherein the driver circuit comprises:
a first driver having an output coupled to the first driver terminal; and
a second driver having an output coupled to the second driver terminal.

20. The circuit of claim 12, wherein the driver circuit comprises:
a first driver having an output coupled to the first driver terminal;
a capacitor coupled between the first driver terminal and the second driver terminal; and
a clamp circuit coupled between the second driver terminal and the second switch node.

21. The circuit of claim 20, wherein the clamp circuit comprises a diode.

22. The circuit of claim 21, further comprising a resistor coupled in parallel with the diode.

23. The circuit of claim 22, wherein:
the first driver is configured to turn the normally-off transistor off for a first period of time; and
a time constant of a capacitance of the capacitor multiplied by a resistance of the resistor is less than the first period of time.

24. The circuit of claim 12, wherein the driver circuit reduces the drive voltage to a voltage below a threshold of the normally-on transistor.

25. The circuit of claim 12, wherein the driver circuit reduces the drive voltage of the normally-on transistor to a voltage that is not below a threshold of the normally-on transistor.

26. The circuit of claim 12, wherein the first switch and the second switch are arranged in an half-bridge configuration.

27. A circuit comprising:
a normally-on transistor coupled in series with a normally-off transistor;
a gate driving circuit having an output coupled to a control node of the normally-off transistor, wherein the gate driving circuit is configured to turn the normally-off transistor off for a first period of time;
a capacitor coupled between the control node of the normally-off transistor and a control node of the normally-on transistor;

a clamp circuit coupled between the control node of the normally-on transistor and a source node of the normally-off transistor; and a resistor coupled between the gate of the normally-on transistor and a source of the normally-off transistor, wherein a time constant of a capacitance of the capacitor multiplied by a resistance of the resistor is less than the first period of time.

28. The circuit of claim 27, wherein the clamp circuit comprises a diode.

* * * * *